United States Patent
Ho et al.

(10) Patent No.: US 6,513,696 B1
(45) Date of Patent: Feb. 4, 2003

(54) WEDGE BONDING HEAD

(75) Inventors: Wing Cheung Ho, Kwai Chung (HK); Gary Peter Widdowson, Kwai Chung (HK); Chun Ho Ho, Kwai Chung (HK); Chi Chung Mok, Kwai Chung (HK); Siu Yan Ho, Kwai Chung (HK)

(73) Assignee: ASM Assembly Automation Ltd., Kwai Chung (HK)

( * ) Notice: Subject to any disclaimer, the term of this patent is extended or adjusted under 35 U.S.C. 154(b) by 0 days.

(21) Appl. No.: 09/649,080

(22) Filed: Aug. 28, 2000

(51) Int. Cl.[7] .................. B23K 37/00; B23K 13/08; B23K 31/00
(52) U.S. Cl. .............. 228/4.5; 228/8; 228/13; 228/180.5
(58) Field of Search ............... 228/4.5, 8, 13, 228/44.3, 180.5, 904

(56) References Cited

U.S. PATENT DOCUMENTS

| | | | |
|---|---|---|---|
| 4,266,710 A | * 5/1981 | Bilane et al. | 228/4.5 |
| 4,456,858 A | * 6/1984 | Loven | 318/138 |
| 4,475,681 A | * 10/1984 | Ingle | 228/4.5 |
| 4,550,871 A | * 11/1985 | Chan et al. | 228/4.5 |
| 4,597,522 A | * 7/1986 | Kobayashi | 228/179 |
| 4,603,803 A | 8/1986 | Chan et al. | |
| 4,817,848 A | * 4/1989 | Gabaldon | 228/102 |
| 4,976,392 A | * 12/1990 | Smith et al. | 228/102 |
| 5,285,949 A | * 2/1994 | Okikawa et al. | 228/179.1 |
| 5,296,767 A | * 3/1994 | Asselin | 310/13 |
| 5,452,838 A | 9/1995 | Farassat | |
| 5,456,403 A | * 10/1995 | Nishimaki et al. | 228/102 |
| 5,501,388 A | * 3/1996 | Takeuchi | 228/1.1 |
| 5,564,616 A | * 10/1996 | Torihata et al. | 228/4.5 |
| 5,566,876 A | * 10/1996 | Nishimaki et al. | 228/102 |
| 5,653,375 A | * 8/1997 | Nam | 228/4.5 |
| 5,699,951 A | * 12/1997 | Miyoshi | 228/4.5 |
| 5,862,974 A | * 1/1999 | Sasano | 228/4.5 |
| 5,894,981 A | * 4/1999 | Kelly | 228/104 |
| 5,897,048 A | * 4/1999 | Cheng et al. | 228/180.5 |
| 5,950,903 A | * 9/1999 | Farassat | 228/1.1 |
| 5,979,737 A | * 11/1999 | Farassat | 228/1.1 |
| 6,070,778 A | * 6/2000 | Takahashi et al. | 228/4.5 |
| 6,129,255 A | * 10/2000 | Terakado et al. | 228/4.5 |
| 6,206,266 B1 | * 3/2001 | Takahashi et al. | 228/102 |
| 6,250,534 B1 | * 6/2001 | Sasano | 228/102 |
| 6,286,749 B1 | * 9/2001 | Lee et al. | 228/102 |

* cited by examiner

*Primary Examiner*—Tom Dunn
*Assistant Examiner*—Zidia Pittman
(74) *Attorney, Agent, or Firm*—Burns, Doane, Swecker & Mathis, LLP

(57) ABSTRACT

The present invention provides a bonding head for a wedge wire bonding apparatus in which the bonding force of the transducer assembly, and also the clamping force of the wire clamping assembly are provided by permanent magnet motors including a coil formed as part of the transducer assembly and the wire clamping assembly respectively and with the coils located between magnets fixed to a bond head bracket member. The use of permanent magnet motors to provide the bonding and clamping forces results in apparatus in which the bonding and clamping forces can be controlled with high accuracy and reliability.

9 Claims, 5 Drawing Sheets

WEDGE BONDING HEAD

FIELD OF THE INVENTION

This invention relates to a bonding head for a wedge wire bonding apparatus, and in particular to such a bonding head having improved bonding force control and wire clamping control in the feeding and tearing mechanism.

BACKGROUND TO THE INVENTION

In a wedge wire bonding apparatus, the bonding head comprises a number of sub-elements that provide functions essential to a successful wedge wire bonding process. Notably, the bonding head includes a transducer which provides the ultrasonic energy required for the bonding process, and the transducer in turn holds the wedge that directs the energy to the wire to form the bond. The bonding head is also required to apply a bonding force to press the wire with the wedge against a bonding pad on, for example, an electronic component (such as an IC die) to which the wire is being bonded. Naturally it is important that this bonding force be carefully controlled.

Another function of the bonding head is to break the wire after the bond has been formed and to feed further wire for the next bond. This is achieved by a wire clamping means that is positioned next to the wedge. To achieve the tearing and feeding of the wire, a mechanism is used to drive the wire along a feeding direction of the wire (and usually at 30°, 45° or 60° to the horizontal).

PRIOR ART

Conventionally, as described for example in U.S. Pat. Nos. 4,603,803 and 5,452,838, both the clamping force of the wire clamp and the bonding force are usually provided by solenoids. These conventional designs have a number of disadvantages, however. These disadvantages include reliability problems, the weight of the solenoids which makes a fast response often very difficult, and also the fact that accurate control of the bonding force and the wire clamp is insufficient for modern wire bonding requirements. Prior art designs also have poor linearity.

SUMMARY OF THE INVENTION

It is accordingly an object of the present invention to provide a wire bonding head that improves over the prior art in the performance of in particular the bonding force control and application, and in the control of the wire feeding and tearing mechanism.

According to the present invention therefore there is provided a bonding head for a wire bonding apparatus for bonding a wire to an electronic component comprising, (a) a bonding member for applying a bonding force to a said wire, said bonding member being adapted to pivot about an axis, (b) means for generating said bonding force comprising a permanent magnet motor for generating a force for causing said bonding member to pivot about said axis upon application of said force, and (c) means separate from said bonding force generating means for moving said bonding head in a vertical direction towards and away from a said electronic component.

The use of a permanent magnet motor to generate the bonding force, provides a number of significant advantages over the prior art. In particular a permanent magnet motor permits reliable control of the bonding force that can be varied linearly over a wide position and current range. The permanent magnet motor is highly reliable and requires no parts that slide against each other causing wear.

In a preferred embodiment of the invention the apparatus is a wedge wire bonding apparatus and the bonding member comprises a wedge member fixed to a distal end of the transducer, and the permanent magnet motor generates a force causing the transducer to pivot about an axis whereby the bonding force is applied through the wedge member.

Preferably the transducer and the permanent magnet motor are fixed to opposite sides of a transducer holder attached to a bond head bracket member by means of a flexure joint, whereby upon application of said force by the permanent magnet motor the transducer holder pivots about the flexure joint. In a particularly preferred arrangement the permanent magnet motor is a voice coil type device and a moving coil is disposed between a magnet or a plurality of permanent magnets fixed to the bond head bracket member. With the magnet(s) fixed to the bracket member and thus not forming part of the moving transducer assembly, a number of mechanical advantages are provided such as low mass of the moving transducer assembly and hence a faster response time. Preferably the permanent magnet motor, the longitudinal axis of said transducer and the direction of the applied bonding force are all disposed in a common plane.

The apparatus may also comprise a bonding force sensor, typically a piezoelectric force sensor or electrostrictive force sensor, which sensor may be used to provide a closed loop control to said voice coil. In addition programmable control means may be provided for enabling a preprogrammed bonding operation to be carried out. Additionally, a contact sensor may also be provided on the transducer holder for determining when the wedge member contacts the component.

The use of a permanent magnet motor in a wire bonding apparatus may also be useful in other parts of the apparatus, such as the wire feeding and tearing assembly. Viewed from another aspect therefore the present invention also provides a bonding head for a wedge wire bonding apparatus for bonding a wire to an electronic component comprising, wire feeding and tearing means for feeding a wire in a wire feeding and tearing direction and including wire clamping means for clamping a wire being fed and for breaking a wire after a bond has been formed, said wire clamping means comprising a pair of jaw members and means for causing opening and closing movement of said jaw members, wherein said opening and closing movement causing means comprises a permanent magnet motor formed of a coil located in a magnetic field created by one or more permanent magnets, wherein either of said coil and said magnet(s) is fixed to one of said jaw members for movement therewith in the wire feeding and tearing direction, the other of said voice coil and said pair of magnets being fixed to a bonding head supporting member.

In a preferred embodiment a first of the jaw members is fixed and the permanent magnet motor causes opening and closing movement of the other the jaw member. This movement may be caused by the coil being fixed to the movable jaw member and being located in a magnetic field produced by at least one magnet, such that the causes the movable jaw member to pivot relative to the fixed jaw member about an axis, which is preferably a preloaded bearing.

The wire clamping assembly is movable in the wire feeding direction, and to achieve this the jaw members and the moving coil are fixed to a bond head bracket member by means of a sliding unit, whereas the permanent magnet(s) are fixed directly to said bracket member. This means that the permanent magnet(s) do not move with the wire clamping assembly reducing the weight of the moving parts.

Using a permanent magnet motor in the wire feeding and tearing assembly provides many advantages that are similar to those described with reference to the permanent magnet motor being used to create the bonding force. These advantages include easy linear control of the wire clamping force and high reliability.

Viewed from a further aspect the present invention provides a bonding head for wedge wire bonding apparatus for bonding a wire to an electronic component comprising, (a) a bonding member for applying a bonding force to a said wire, said bonding member being adapted to pivot about an axis, (b) means for generating said bonding force comprising a permanent magnet motor for generating a force for causing said bonding member to pivot about said axis upon application of said force, (c) means separate from said bonding force generating means for moving said bonding head in a vertical direction towards and away from a said electronic component, and (d) wire feeding and tearing means for feeding a wire in a wire feeding and tearing direction and including wire clamping means for clamping a wire being fed and for breaking a wire after a bond has been formed, said wire clamping means comprising a pair of jaw members and means for causing opening and closing movement of said jaw members, wherein said opening and closing movement causing means comprises a permanent magnet motor formed of a coil located in a magnetic field created by at least one permanent magnet, wherein either of said coil and said magnet(s) is fixed to one of said jaw members for movement therewith in the wire feeding and tearing direction, the other of said voice coil and said pair of magnets being fixed to a bonding head support member.

BRIEF DESCRIPTION OF THE DRAWINGS

An embodiment of the present invention will now be described by way of example and with reference to the accompanying drawings, in which.

DETAILED DESCRIPTION OF PREFERRED EMBODIMENTS

Figure 1:
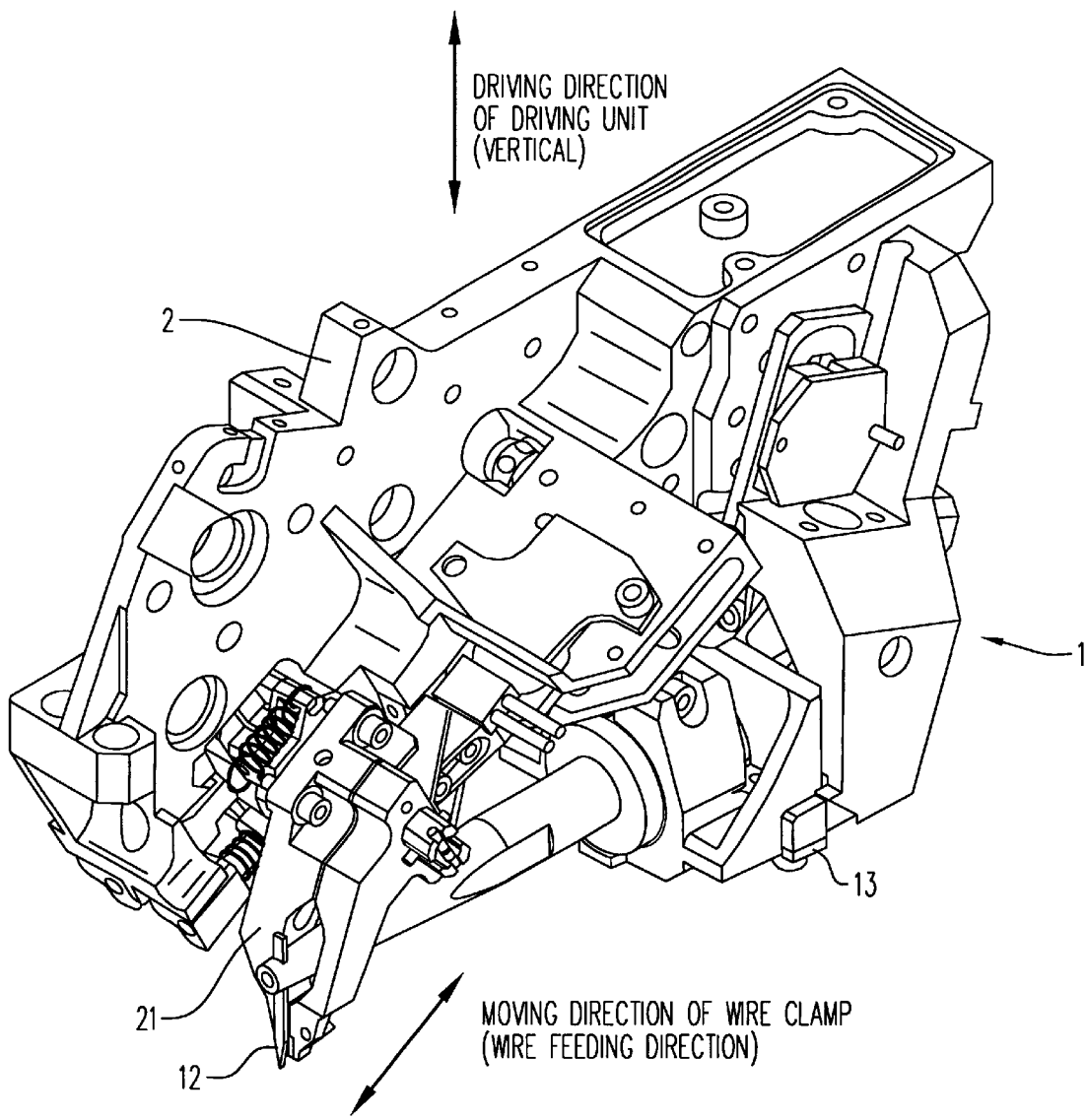
FIG. 1 is a perspective view of a wedge wire bonding head according to an embodiment of the present invention.

Referring firstly to FIG. 1 there is shown the general structure of the bonding head 1 of a wedge wire bonding apparatus. The bonding head 1 is fixed to a bonding head bracket 2 that in turn allows the bonding head 1 to be secured to a sliding mechanism (not shown) that allows the bonding head 1 to be moved up and down in the Z direction during the bonding process. Means are provided for moving the bonding head in the Z direction. The bonding head 1 includes a number of sub-assemblies, in particular a transducer assembly and a wire clamp assembly both of which will be described in more detail below. The transducer assembly serves to provide ultrasonic energy for forming the bond, while the wire clamp assembly functions to clamp the wire so that it may be severed after a bond has been formed and also serves to feed wire for the next bond to be formed.

Figure 2:
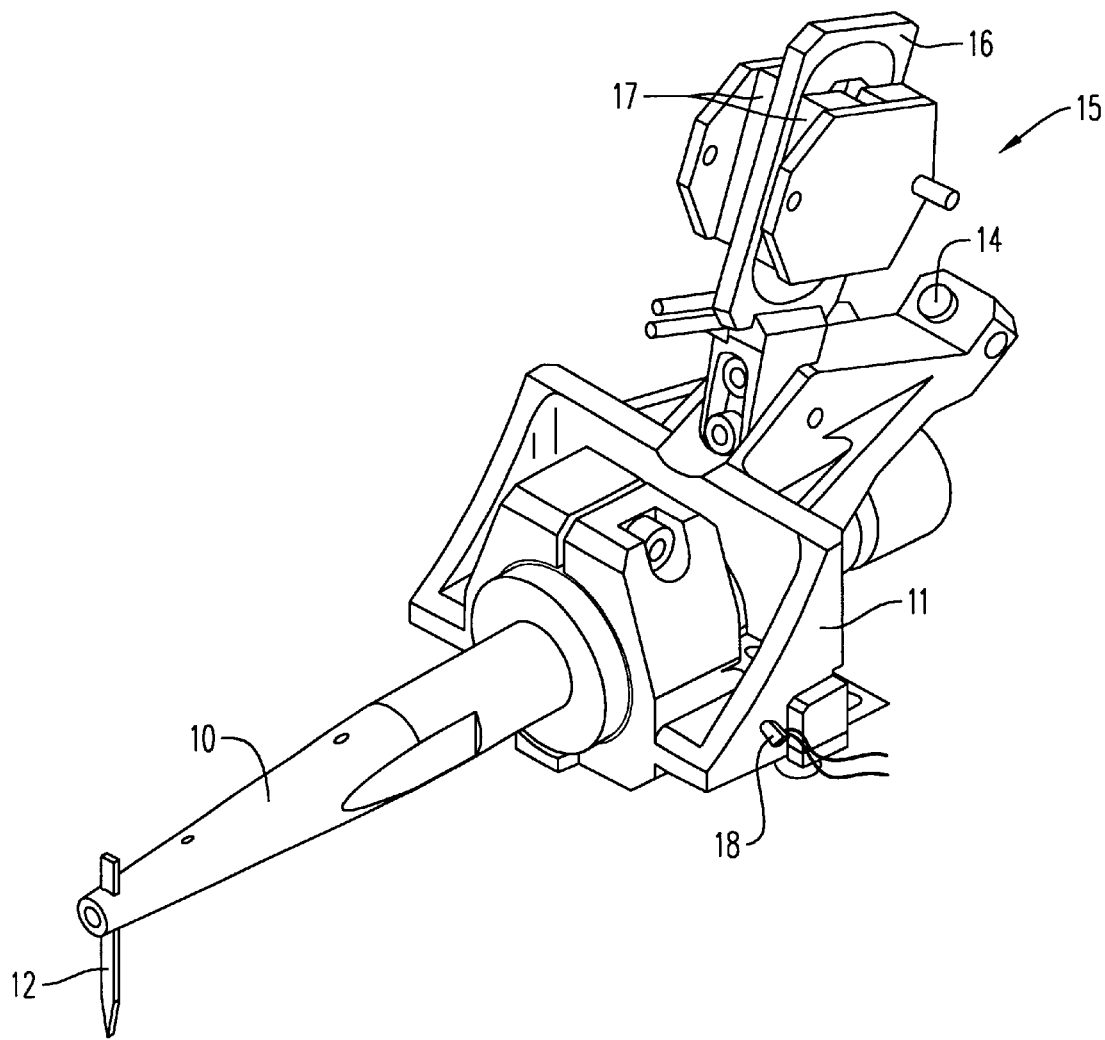
FIG. 2 is a perspective view of a detail of FIG. 1 showing the transducer and the means for applying bonding force.

FIG. 2 shows the transducer assembly in more detail and for the sake of clarity shows the transducer assembly separated from the remainder of the bonding head 1. The major component of the transducer assembly is the transducer 10 which is held at one end thereof in a transducer holder 11 and at the other distal end thereof is provided with a wedge 12. The transducer holder 11 is mounted to the bonding head bracket member 2 be means of a flexure joint 13 (FIG. 1) which may for example by a flexure pivot, clamped leaf spring(s) or a monolithic flexure structure.

In a bonding operation, the transducer supplies ultrasonic energy to the wedge to effect the formation of the bond. Prior to the bond being formed, the entire bonding bead is moved downwardly in the Z direction until the wedge 12 and the wire to be bonded (which is supplied by the wire feeding and tearing means as will be described shortly) contact the electronic component (eg an integrated circuit board) where a bond is to be formed. A contact sensor 14 is used to detect this contact level, or alternatively the feedback control of the bonding force applying means to be described below may be used to detect this contact. After this contact is detected, the bonding head 1 is moved downwardly a further small amount to ensure that the wedge properly contacts the wire during the bonding operation.

During the bonding operation it is necessary for a bonding force to be applied through the wedge. This bonding force must be carefully controlled to ensure that the wedge 12 presses the wire against a bonding pad formed on the electronic component. In this embodiment of the present invention, the bonding force is applied by a moving coil permanent magnet motor 15 that generates a force tangential to a pivot axis defined by the flexure joint and thus causes the transducer assembly to pivot about that axis. That is to say the force is directed at right angles to the pivot axis and spaced therefrom so as to cause pivotal movement about said pivot axis. It will be understood of course that the force may be such that it has at least a component directed in this sense. The moving coil permanent magnet motor 15 comprises a moving coil 16 which is attached to the transducer holder 11 and which is located between two pairs of magnets 17 which are fixed to the bonding head bracket member 2.

The use of a permanent magnet motor to provide the bonding force has a number of advantages. Firstly, although the coil 16 will move relative to the magnets 17 during bonding, this movement is very small and the bonding force is therefore almost constant because the force applied by the moving coil will not vary significantly during the application of the bonding force. A constant bonding force is therefore created and it is not necessary to recalibrate the bonding apparatus for different wire diameters and different electronic devices. Furthermore, control of the bonding force may be achieved easily by controlling the current flowing in the permanent magnet motor 15. Linear control of the bonding force can be obtained over a wide position and current range. In addition, a bonding force sensor (for example a piezoelectric sensor or strain gauge) 18 may be used to monitor the bonding force and to apply a closed loop control of the the bonding force. With the application of such closed loop control of the bonding force, it may also be possible to eliminate the contact sensor altogether. In addition, the bonding operation may be controlled by a preprogrammable bonding force generating means.

The preferred embodiment of the present invention also provides a number of mechanical advantages over the prior. For example, by locating the magnets on the bonding head bracket member 2 rather than as part of the transducer assembly, the weight of the transducer assembly may be minimised resulting in faster response time. The permanent magnet motor requires no sliding parts which increases reliability. The permanent magnet motor is located on the opposite side of the transducer holder from the transducer itself, whereby the mass of the transducer assembly may be balanced around the pivot axis. In addition to improving response of the transducer assembly, this eliminates the effect of inertia force on the assembly during high speed travel in the Z direction.

Figure 3:
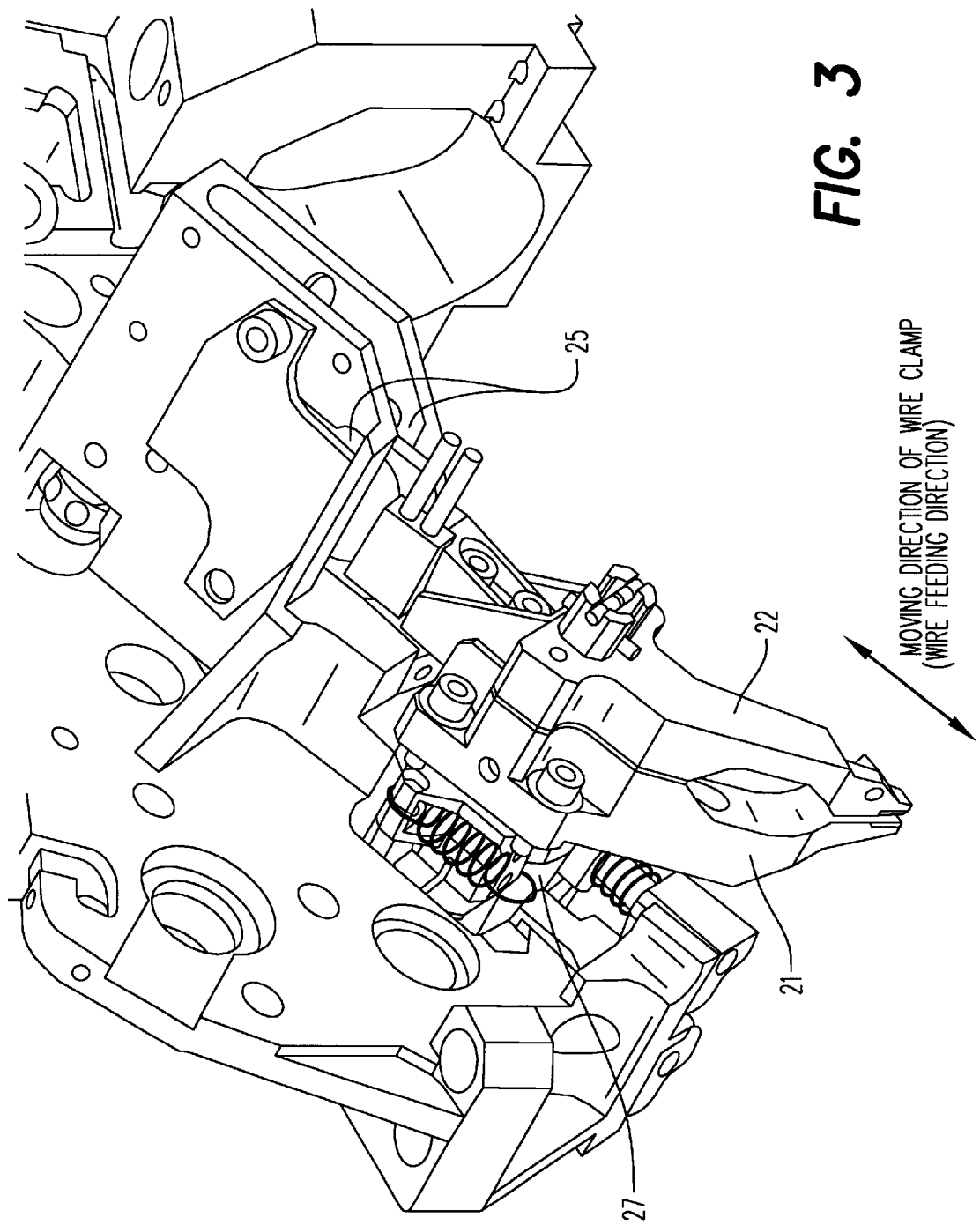
FIG. 3 is a perspective view of a detail of FIG. 1 showing the wire clamping mechanism.
Figure 4:
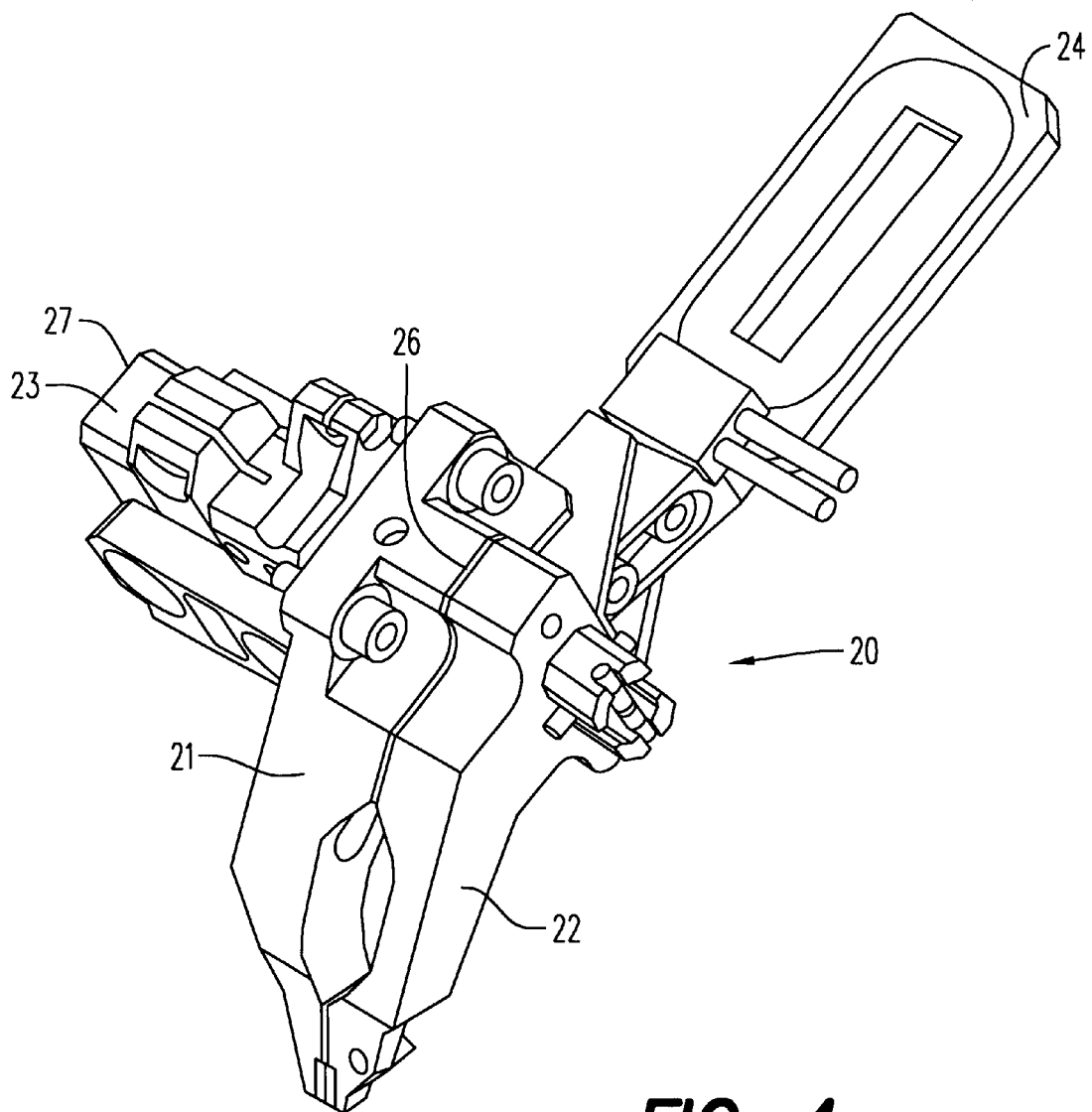
FIG. 4 shows a detail of the wire clamping mechanism of FIG. 3 separated from the bonding head for clarity.

Referring now to FIG. 3, there is shown a detail of the bonding head 1 illustrating the wire clamp assembly 20. FIG. 4 shows the wire clamp assembly separated from the bonding head for the sake of clarity of illustration. In particular, the wire clamp assembly comprises a pair of jaw members, a fixed jaw member 21 and a moving jaw member 22. The wire clamp assembly is mounted to the bonding head bracket member 2 by means of a sliding unit 23 which enables the wire clamp assembly 20 to move in the wire feeding direction (see FIG. 3). Fixed to the rear of the moving jaw member 22 is a moving coil 24 which is located between two pairs of magnets 25 fixed directly to the bonding head bracket member 2 and not fixed to the sliding unit 23. The permanent magnet motor formed of the moving coil 24 and magnets 25 generates a force that causes the moving jaw member 22 to pivot about a spring-biased jewel bearing 26 away from and towards the fixed jaw member 21. Thus by the application of current to the moving coil 24 the jaw can be opened and closed. A stopper may be provided on the bonding head bracket member 2 to limit the movement of the moving jaw member 22.

In use of the bonding apparatus of this embodiment of the present invention, after a bond has been formed, the jaw members 21,22 clamp the wire while the wedge continues to exert a bonding force and the sliding unit 23 is operated to move the clamp assembly along the wire feeding direction but away from the bond so as to break the wire. Subsequent feeding of wire for the next bond is carried out in a conventional sequence, for example as described in U.S. Pat. No. 4,603,803 and will therefore not be described here in detail.

The wire clamp assembly is slidably mounted to the bonding head bracket member 2 through the sliding unit 23 such that the wire clamp assembly can be moved along the feed axis, which may be set to be any desired angle to the horizontal, for example 30°, 45° or 60°. The sliding unit 23 may be driven by a solenoid, stepper or the like acting on the moving plate 27 of the sliding unit 23.

Figure 5:
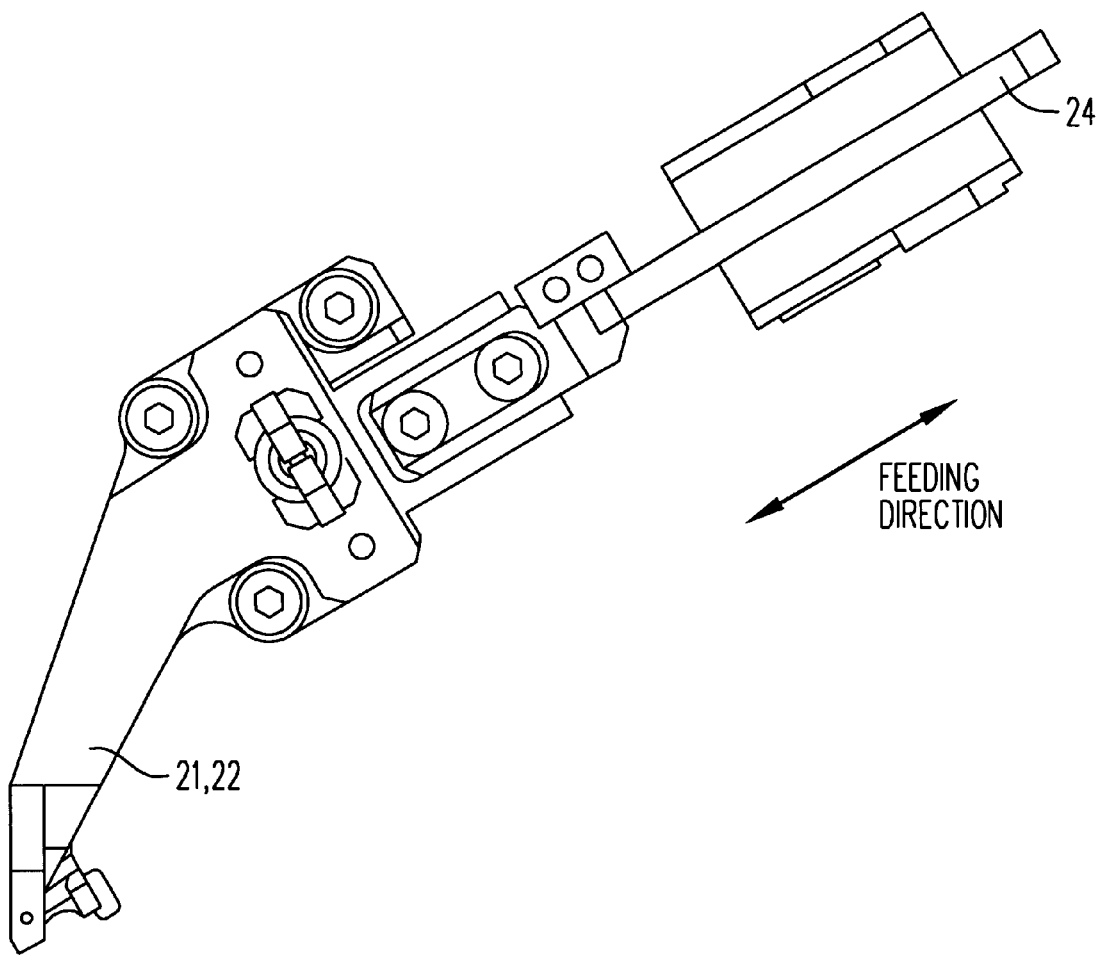
FIG. 5 is a side view of a part of the wire feeding and tearing mechanism.

It should be noted, for example from FIG. 5, that during movement of the wire clamp assembly along the feeding direction, the moving coil 24 remains located between the magnets 25 and thus the jaw members 21,22 can be opened or closed at any time during the cycle, thus decoupling the opening/closing of the wire clamp assembly from the position of the wire clamp assembly. This enables optimisation of the performance speed of the wire clamp assembly in that it is not necessary for the assembly to be in any given position for the jaw members 21,22 to be opened or closed. Although because of the movement of the moving coil 24 relative to the magnets 25 the line of action of the force generated by the voice coil motor may be displaced, this will be small and will cause a change in the clamping force of less than 1%.

As with the design of the bonding force assembly, the use of a permanent magnet motor to generate the clamping force has a number of advantages over the prior art. In particular, the use of a permanent magnet motor permits reliable control of the clamping force which is linear over a wide range. The permanent magnet motor has no sliding parts and is therefore highly reliable, and by locating the magnets 25 on the bonding head bracket member 2 the weight of the wire clamp assembly can be minimised giving a faster response time.

It should also be understood that in the design of the permanent magnet motors, a number of variations will be readily appreciated by a person skilled in the art. For example, the coil may move relative to fixed magnets, or vice versa. In addition, the oil may be located within a magnetic field that may be created by a plurality of magnets, or may be located between two poles of one magnets (eg a U-shaped magnet). The invention should be understood to embrace all such possibilities.

What is claimed is:

1. A bonding head for a wedge wire bonding apparatus for bonding a wire to an electronic component comprising, wire feeding and tearing means for feeding a wire in a wire feeding and tearing direction and including wire clamping means for clamping a wire being fed and for breaking a wire after a bond has been formed, said wire clamping means comprising a pair of jaw members and means for causing opening and closing movement of said jaw members, wherein said opening and closing movement causing means comprises a permanent magnet motor formed of a coil located in a magnetic field created by one or more magnets, wherein either of said coil and said magnet(s) is fixed to one of said jaw members for movement therewith in the wire feeding and tearing direction, the other of said coil and said magnet(s) being fixed to a bonding head support member.

2. A bonding head as claimed in claim 1 wherein a first of said jaw members is fixed and said permanent magnet motor causes opening and closing movement of the other said jaw member.

3. A bonding head as claimed in claim 2 wherein said permanent magnet motor comprises a coil fixed to said movable jaw member and located in a magnetic field created by at least one magnet, and wherein said permanent magnet motor causes said movable jaw member to pivot about an axis.

4. A bonding head as claimed in claim 3 wherein said movable jaw member pivots about a pre-loaded bearing.

5. A bonding head as claimed in claim 4 wherein said jaw members and said coil are fixed to a bonding head bracket member by means of a sliding unit for movement in the feeding and tearing direction, and wherein said magnet(s) are fixed directly to said bracket member.

6. A bonding head as claimed in claim 5 wherein said coil is positioned such that the feeding direction lies in the plane of said coil and such that the spacing between the coil and the magnet(s) remains the same as the coil moves in the feeding direction.

7. A bonding head for wedge wire bonding apparatus for bonding a wire to an electronic component comprising,
(a) a bonding member for applying a bonding force to a said wire, said bonding member being adapted to pivot about an axis,
(b) means for generating said bonding force comprising a permanent magnet motor for generating a force for causing said bonding member to pivot about said axis upon application of said force, (c) means separate from said bonding force generating means for moving said bonding head in a vertical direction towards and away from a said electronic component, and (d) wire feeding and tearing means for feeding a wire in a wire feeding and tearing direction and including wire clamping means for clamping a wire being fed and for breaking a wire after a bond has been formed, said wire clamping means comprising a pair of jaw members and means for causing opening and closing movement of said jaw members, wherein said opening and closing movement causing means comprises a permanent magnet motor formed of a coil located in a magnetic field created by at least one magnet, wherein either of said coil and said magnet(s) is fixed to one of said jaw members for movement therewith in the wire feeding and tearing direction, the other of said coil and said magnet(s) being fixed to a bonding head support member.

8. A bonding head as claimed in claim 1 wherein said permanent magnet motor is a voice coil type device.

9. A bonding head as claimed in claim 7 wherein said means for generating said bonding force comprises a voice coil type permanent magnet motor, and where said opening and closing movement causing means comprises a voice coil type permanent magnet motor.

* * * * *